(12) United States Patent
Peters

(10) Patent No.: US 8,476,612 B2
(45) Date of Patent: Jul. 2, 2013

(54) METHOD FOR FORMING A LATERAL PHASE CHANGE MEMORY ELEMENT

(75) Inventor: John M. Peters, Cupertino, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/218,331

(22) Filed: Aug. 25, 2011

(65) Prior Publication Data

US 2011/0309320 A1 Dec. 22, 2011

Related U.S. Application Data

(62) Division of application No. 12/346,609, filed on Dec. 30, 2008, now abandoned.

(51) Int. Cl.
*H01L 29/02* (2006.01)
*H01L 47/00* (2006.01)
*G11C 11/00* (2006.01)

(52) U.S. Cl.
USPC ........ 257/2; 257/4; 257/52; 438/95; 438/102; 365/100; 365/148; 365/163

(58) Field of Classification Search
None
See application file for complete search history.

(56) References Cited

U.S. PATENT DOCUMENTS

| | | | |
|---|---|---|---|
| 6,589,714 B2 * | 7/2003 | Maimon et al. | 430/313 |
| 6,894,305 B2 * | 5/2005 | Yi et al. | 257/4 |
| 7,018,911 B2 * | 3/2006 | Lee et al. | 438/466 |
| 7,214,632 B2 | 5/2007 | Chiang | |
| 7,262,502 B2 * | 8/2007 | Chang | 257/758 |
| 7,696,503 B2 * | 4/2010 | Lung et al. | 257/2 |
| 7,928,421 B2 * | 4/2011 | Lung | 257/3 |
| 7,964,468 B2 * | 6/2011 | Lung et al. | 438/382 |
| 2006/0071244 A1 * | 4/2006 | Gutsche et al. | 257/250 |
| 2007/0096071 A1 * | 5/2007 | Kordus et al. | 257/2 |
| 2007/0108077 A1 * | 5/2007 | Lung et al. | 206/387.1 |
| 2007/0109843 A1 * | 5/2007 | Lung et al. | 365/163 |
| 2007/0155172 A1 * | 7/2007 | Lai et al. | 438/666 |
| 2008/0007995 A1 | 1/2008 | Schwerin | |
| 2009/0026435 A1 | 1/2009 | Kakegawa | |
| 2010/0163829 A1 | 7/2010 | Wang et al. | |

OTHER PUBLICATIONS

Hosaka, S. et al., "Proposal for a Memory Transistor Using Phase-Change and Nanosize Effects," Microelectronic Engineering 73-74:736-740, 2004.

Liao, F. et al., "Characterization of Ge2Sb2Te5 Thin Film Transistor and its Application in Non-Volatile Memory," Microelectronics Journal 37:841-844, 2006.

* cited by examiner

*Primary Examiner* — Evan Pert
*Assistant Examiner* — Andres Munoz
(74) *Attorney, Agent, or Firm* — Seed IP Law Group PLLC

(57) ABSTRACT

A method of manufacturing a phase change memory (PCM) includes forming a pinch plate layer transversely to a PCM layer that is insulated from the pinch plate layer by a dielectric layer. Biasing the pinch plate layer causes a depletion region to form in the PCM layer. During a read of the PCM in a reset or partial reset state the depletion region increases the resistance of the PCM layer significantly.

22 Claims, 10 Drawing Sheets

METHOD FOR FORMING A LATERAL PHASE CHANGE MEMORY ELEMENT

BACKGROUND

1. Technical Field

The present disclosure relates generally to phase change memories.

2. Description of the Related Art

Phase change memory (PCM) devices, also known as ovonic unified memory (OUM) devices, use phase change materials, i.e., materials that may be electrically switched between a generally amorphous and a generally crystalline state or between different detectable states of local order across the entire spectrum between completely amorphous and completely crystalline states, for electronic memory application. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

A phase change memory device includes an array of memory cells, each memory cell comprising a memory element and a selection element. Both the memory element and the selection element may be made of a chalcogenide material. The memory element and the selection element may be sandwiched between a lower electrode and an upper electrode. Select devices may also be referred to as an access device, an isolation device, or a switch.

Programming of the phase change material to alter its state or phase may be accomplished by applying voltage potentials across the electrodes, thereby generating a voltage potential across the select device and the memory element. When the voltage potential is greater than the threshold voltages of the select device and the memory element, an electrical current may flow through the phase change material in response to the applied voltage potentials, and may result in heating of the phase change material.

This heating may alter the memory state or phase of the phase change material, thus altering the electrical characteristic of the memory material, e.g., the resistance. Thus, the memory material may also be referred to as a programmable resistance material.

The amorphous or semi-amorphous state may be associated with a "reset" state or a logic "0" value, while a crystalline or semi-crystalline state may be associated with a "set" state, or a logic "1" value. The resistance of memory material in the amorphous or semi-amorphous state is generally greater than the resistance of memory material in the crystalline or semi-crystalline state. It is to be appreciated that the association of reset and set with amorphous and crystalline states, respectively, is a convention and that at least an opposite convention may be adopted.

Using an electrical current, the memory material may be heated to a relatively higher temperature to amorphize memory material and "reset" memory material (e.g., program memory material to "0"). Heating the volume of memory material to a relatively lower crystallization temperature may crystallize memory material and "set" memory material (e.g., program memory material to "1"). Various resistances of memory material may be achieved to store information by varying the amount of current flow and duration through the volume of memory material.

BRIEF SUMMARY

In accordance with one embodiment of the present disclosure, a method of forming a phase change memory cell is provided. The forming includes forming a first phase change layer, forming first and second electrodes at opposite first and second ends of the first phase change layer, forming a first dielectric layer on a side of the first phase change layer, and forming a conductive layer separated from the first phase change layer by the first dielectric layer, the conductive layer being configured to produce a carrier depletion region in the first phase change layer.

DETAILED DESCRIPTION

Figure 1:
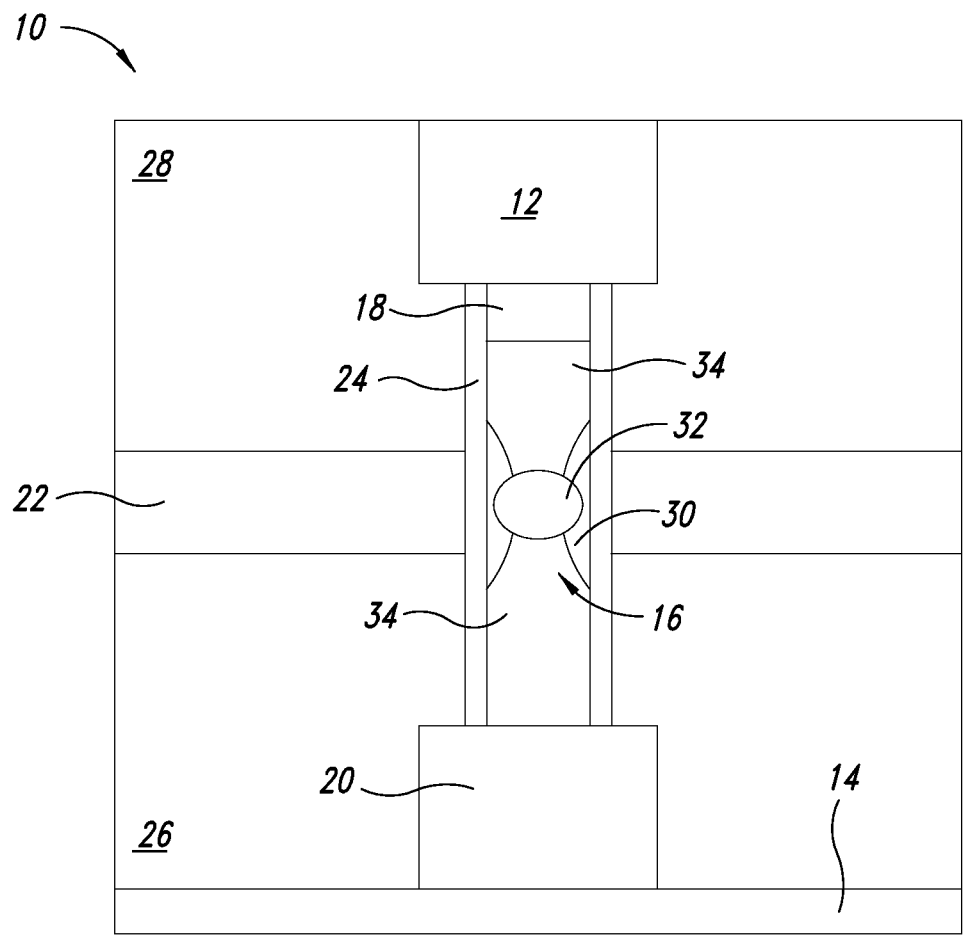
FIG. 1 shows an enlarged cross-sectional view of a phase change memory cell in a reset state according to one embodiment of the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale. For example, the shapes of various features are not drawn to scale, and some of these features are arbitrarily enlarged and positioned to improve drawing legibility.

FIG. 1 illustrates a vertically integrated phase change memory (PCM) cell 10 in accordance with one embodiment of the present disclosure. The PCM cell 10 is coupled between a conductive bitline 12 and a conductive wordline 14 formed at opposite ends of a PCM layer 16. A conductive top electrode 18 separates the bitline 12 from the PCM layer 16 and a conductive bottom electrode 20 separates the wordline 14 from the PCM layer 16.

The PCM cell 10 also includes a pinch plate layer 22 formed transversely to the PCM layer 16. In FIG. 1, the pinch plate layer 22 completely laterally surrounds a mid-portion of the PCM layer 16. Alternatively, separate pinch plate layers could be positioned on opposite sides of the PCM layer 16. The pinch plate layer 22 is positioned between two dielectric layers 26 and 28. The lower dielectric layer 26 encases the wordline 14, the lower electrode 20, and a lower portion of the PCM layer 16. The upper dielectric layer 28 encases the bitline 12, top electrode 18, and an upper portion of the PCM layer 16.

A dielectric spacer 24 completely laterally surrounds the PCM layer 16 and separates the pinch plate layer 22 and dielectric layers 26, 28 from the PCM layer 16. In the embodiment of FIG. 1, the dielectric spacer 24 extends fully from the bitline 12 to the bottom electrode 20. Alternatively, the dielectric spacer could extend less than fully from the bitline 12 to the bottom electrode 20 and still insulate the PCM layer 16 from the pinch plate layer 22. Also, in embodiments in which the pinch plate layer 22 does not fully laterally surround the PCM layer 16, the dielectric spacer 24 could also extend less than fully around the PCM layer 16. The dielectric spacer 24 may be silicon nitride, silicon oxide, or any other suitable insulating material.

The PCM layer 16 is typically formed with one or more chalcogenide elements, i.e., Group VI elements from the periodic table, such as tellurium, sulfur, or selenium. Chalcogenide materials can form non-volatile memory materials that store and retain information even after removal of electrical power. One common chalcogenide combination is GST (germanium-antimony-tellurium). However, any known suitable phase change material may be used.

In a preferred embodiment, the pinch plate layer 22 comprises a material composition that is electrically conductive with a low thermal conductivity. The pinch plate layer 22 does not need to be highly conductive since no current flows through the pinch plate layer 22. For example, the pinch plate layer 22 may be carbon, or a conductive alloy such as TiAlN, MoN, TiSiN, TaSiN, CoSiN, a conductive oxide, such as RuSio, or an alloy where the transition metal does not form an oxide, such as PdSiO. Alternatively, the pinch plate layer 22 may be a chalcogenide material such as bismuth-telluride which has poor thermal conductivity and a high crystallization temperature.

Programming of the PCM cell 10 occurs by pulses of current applied between the bitline 12 and the wordline 14. The programming current rises to a "reset" current value and holds the "reset" current value for a period of time sufficient to melt the PCM layer 16. The cooling stage determines if the PCM layer 16 solidifies in a high or low resistance state. A faster cooling process arranges the PCM layer 16 in the high resistance state, the "reset" state (amorphous). A slower cooling process arranges the PCM layer 16 in the low resistance state, the "set" state (crystalline). Certain cooling conditions can cause a partial "reset" or a partial "set" state to occur with intermediate resistance values.

When the PCM layer 16 solidifies in the high resistance reset state at least a portion of the PCM layer 16 is in an amorphous state, amorphous region 32. A crystalline region 34 of the PCM layer 16 surrounds the amorphous region 32. The width of the amorphous region 32 is unpredictable. If the pinch plate 22 were not used and the amorphous region 32 does not extend to the boundaries of the PCM layer 16 (i.e., to the dielectric spacer 24), some of the read current would shunt around the amorphous region 32 and the PCM cell 10 could be misread as a partial reset or a set state. To prevent such a problem, prior art devices would require more programming current to adequately melt the PCM layer 16 and form the amorphous 32 entirely across the PCM layer.

Instead, the pinch plate layer 22 of FIG. 1 enables a lower programming current during programming and a lower read current during reading. During a read of the PCM cell 10 in a full reset state, as shown in FIG. 1, electrically biasing the pinch plate layer 22 forms an electric field that causes a majority carrier depletion region 30 to be formed in the PCM layer 16. In one embodiment, majority carrier depletion causes the depletion region 30 to overlap the amorphous region 32 and prevents the read current from bypassing the amorphous region 32. As a result, the resistance is greatly increased, which enables a lower read current to be used to read the PCM cell 10. In addition, a lower programming current can be employed during programming because the amorphous region 32 does not need to extend entirely to the outside walls of the PCM layer 16 in order to obtain a full reset state.

In one embodiment, a positive bias is applied to the pinch plate layer 22, which forms a depletion region 30 where the amorphous region 32 is geometrically thinnest in the vertical direction. Advantageously, the depletion region 30 causes the reset resistance through the PCM layer 16 to dramatically increase during a read. Furthermore, during programming, the PCM layer 16 reaches the melting temperature more quickly with the depletion region 30 in place. Advantageously, lower programming currents also translate into smaller PCM array size.

Biasing the pinch plate layer 22 electrically pinches the device during memory operation. More particularly, the actively charged pinch plate layer aids in pinching off electron flow through the cross-sectional area of the PCM layer 16. The bias may be applied constantly while the memory is on. In a preferred embodiment, the pinch plate layer 22 is biased with a positive voltage in the range of 1 Volt and 4 Volts. However, different electrical conditions for reading and for programming may be applied to the pinch plate layer 22 for higher accuracy or higher voltages.

Figure 2:
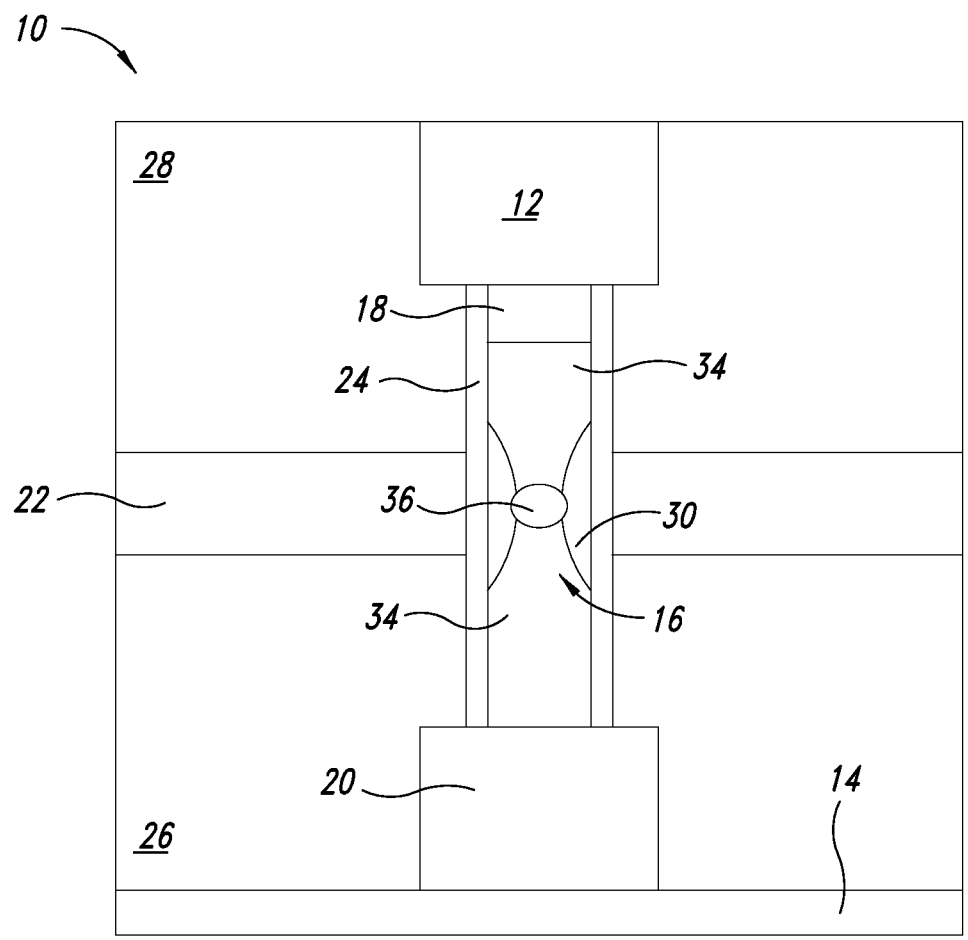
FIG. 2 shows an enlarged cross-sectional view of a phase change memory cell in a partial reset state.

FIG. 2 illustrates a read of PCM cell 10 in a partial reset state, i.e., a smaller amorphous region 36 forms in the PCM layer 16. In the partial reset state, the amorphous region 36 may not fully extend to the dielectric spacer 24. Without the biased pinch plate layer 22, the PCM cell 10 would only have an intermediate resistance during the read because of the crystalline region 34 between the amorphous region 36 and the dielectric spacer 24. As discussed above, the depletion region 30 dramatically increases the resistance of the PCM layer 16 by cooperating with the amorphous region 36 and thereby reduces the programming current. Reducing the programming current advantageously reduces power consumption and improves device reliability.

Figure 3:
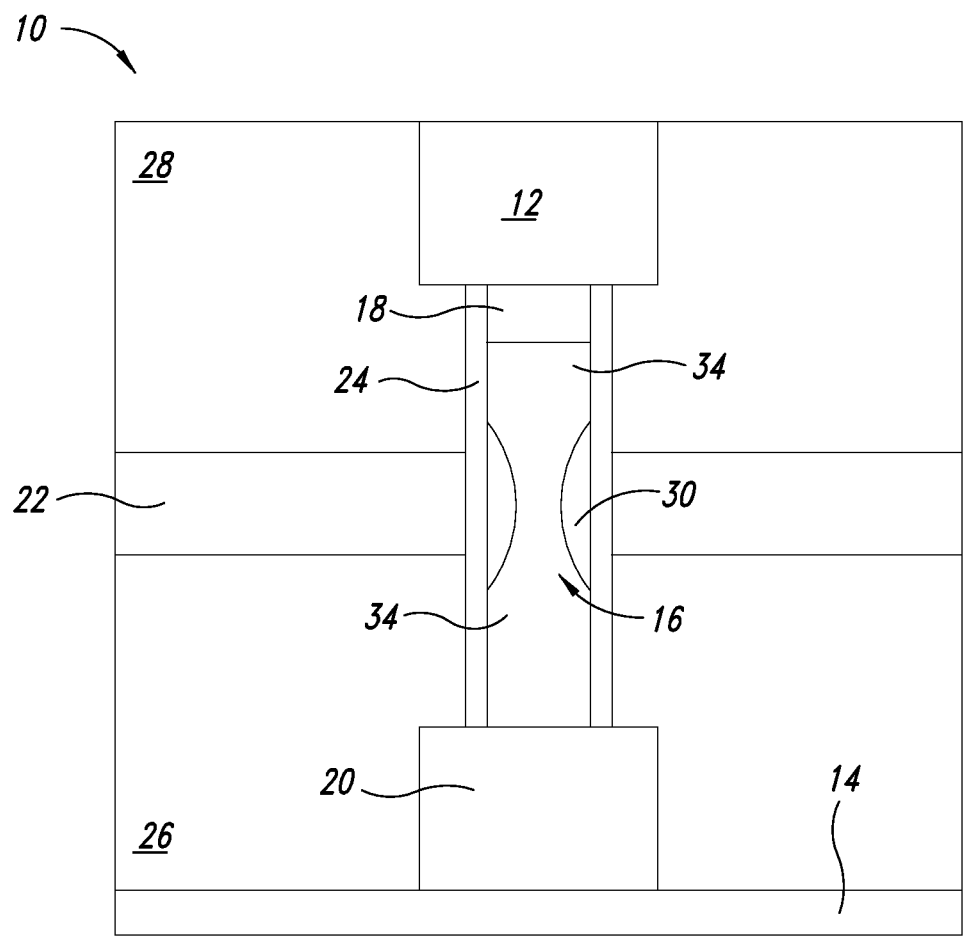
FIG. 3 shows an enlarged cross-sectional view of a phase change memory cell in a fully set state.

FIG. 3 illustrates a read of PCM cell 10 in a fully set state, i.e., the crystalline region 34 spans the entire length of the PCM layer 16. The extension of the depletion region 30 partially into the crystalline region 34 slightly increases the resistance of the set state, but not enough to be read as a partial reset or a reset state. Preferably, the bias placed on the pinch plate layer 22 is at a level where the depletion region 30 does not completely obstruct the crystalline region 34.

In one embodiment, the PCM cell 10 is one of many PCM cells in a memory array. Each PCM cell is formed with a select device. The select device may be an ovonic threshold switch (OTS), a PN diode, a MOS transistor, or any other suitable select device. If the bias is applied during a programming operation, the threshold voltage may increase significantly when biasing the pinch plate layer 22, which may be advantageous if the select device is an OTS.

Figure 4:
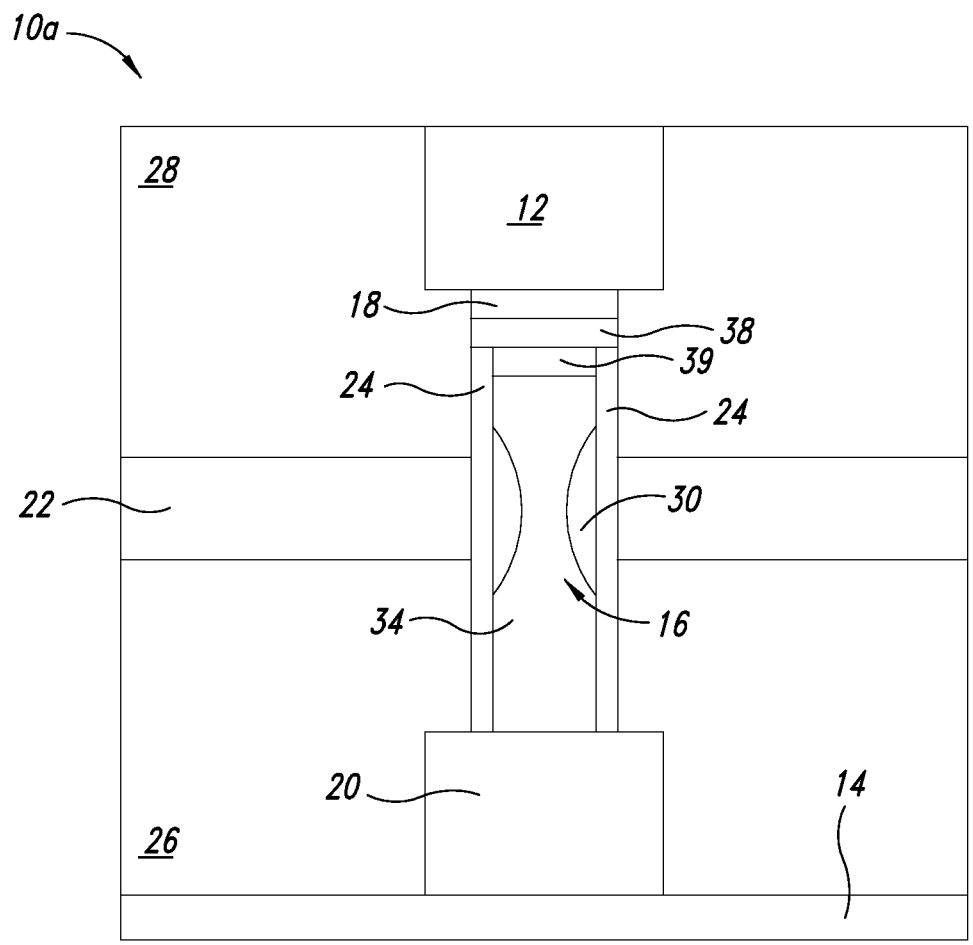
FIG. 4 shows an enlarged cross-sectional view of a phase change memory cell with an OTS.
Figure 5:
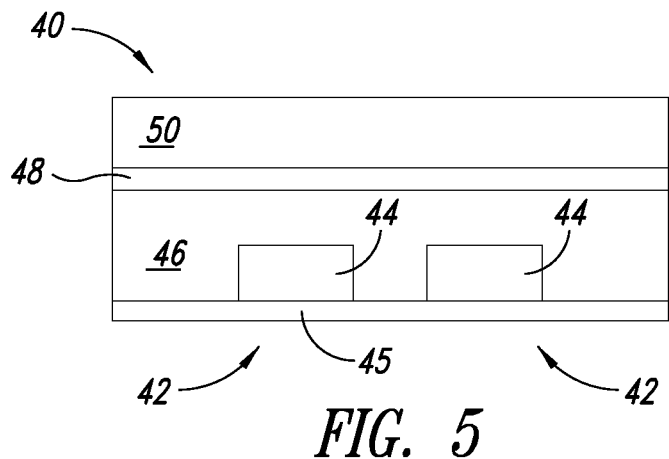
FIGS. 5-10 are enlarged, cross-sectional views of a method of manufacturing a phase change memory device according to one embodiment of the present disclosure.

Shown in FIG. 4 is a PCM cell 10A that includes an OTS 38 formed between the top electrode 18 and a middle electrode 39. The OTS 38 could be used to read the threshold voltage of the PCM cell 10A rather than reading the resistance of the PCM layer 16. A larger amorphous region in the PCM layer 16 creates a higher threshold voltage. A read of the threshold voltage may determine the PCM cell 10A is in the "reset" state if the voltage potential across the PCM layer 16 is below the threshold voltage. On the other hand, if the voltage potential across the PCM cell 10A is higher than the threshold voltage, the PCM cell 10A would be in the "set" state.

The OTS 38 may be a chalcogenide alloy that may be in a substantially amorphous state positioned between two electrodes that may be repeatedly and reversibly switched between a higher resistance "off" state and a relatively lower resistance "on" state by application of a predetermined electrical current or voltage potential. In this embodiment, each select device may be a two-terminal device that may have a current-voltage (I-V) characteristic similar to a phase change memory element that is in the amorphous state. However, unlike a PCM element, the switching material of select devices may not change phase. That is, the switching material of select devices may not be a programmable material, and, as a result, select devices may not be capable of storing information. For example, the switching material of select devices may remain permanently amorphous and the I-V characteristic may remain the same throughout the operating life of the device.

FIGS. 5-10 illustrate a fabrication process for making a phase change memory (PCM) 40 according to one embodiment the present disclosure. The process described with respect to FIGS. 5-10 discusses the fabrication of two PCM cells 42, but those skilled in the art would instantly recognize that the process can be implemented to make many more PCM cells in the PCM 40. One skilled in the art will recognize that other sequences and other steps could be employed to make the phase change memories described herein.

Initially, the process forms bottom electrodes 44 on a wordline 45 and in a first dielectric layer 46. The wordline 45 may be formed of tungsten, aluminum, copper, or any other suitable conductive material. Only one wordline 45 is shown in FIGS. 5-10, but the PCM 40 includes many parallel wordlines in a typical embodiment.

The process then forms a pinch plate layer 48 over the first dielectric layer 46 and second dielectric layer 50 over the pinch plate layer 48. As discussed above, the pinch plate layer 48 may be any number of conductive materials including, but not limited to TiAlN, TiSiN, and MoN.

In one embodiment, the bottom electrodes 44 and wordline 45 are deposited as layers on a semiconductor substrate and then etched using a mask to form the desired configuration. Alternatively, a damascene process could be used to form the bottom electrodes 44, where the dielectric layer 46 is deposited first on the semiconductor substrate and etched to form openings, such as pores. Then successive deposition and etchback steps fill the openings with the bottom electrodes 44. After the bottom electrodes 44 form, another dielectric layer (not shown) forms on the bottom electrode 44 and the first dielectric layer 46.

Figure 6:
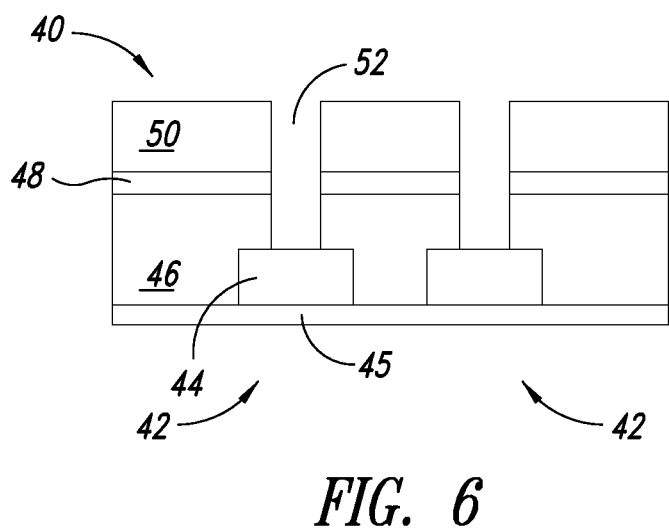

Thereafter, as shown in FIG. 6, pores 52 are formed in the first dielectric layer 46, the pinch plate layer 48, and the second dielectric layer 50, and over the bottom electrodes 44. The pore may be patterned and etched using high aspect ratio openings with a dry etch sequence. Alternatively, a conventional via formation technique may be used to form the pores 52. Ideally, the pores 52 align over a center axis of each bottom electrode 44 and do not extend past the boundaries of the bottom electrode 44.

Figure 7:
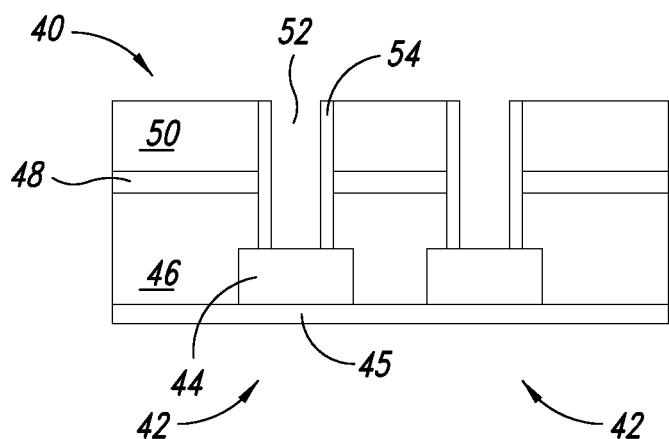

As shown in FIG. 7, the process deposits and anisotropically etches a dielectric layer to form dielectric spacers 54 in the pores 52, respectively. The dielectric spacers 54 can be formed of silicon nitride, silicon oxide, or any other non-conductive material. Preferably, the entire width of each dielectric spacer 54 is within the boundary of the respective bottom electrode 44, i.e., the entire bottom surface of the dielectric spacer 54 is in contact with the bottom electrode 44.

Figure 8:
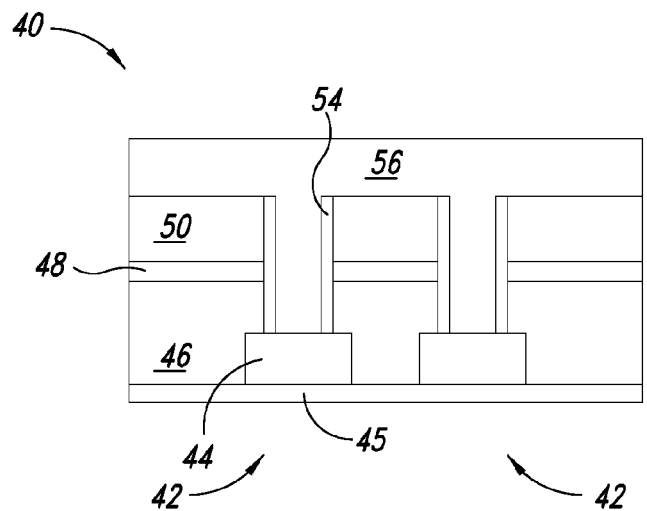

After formation of the spacers 54, the pores 52 are filled with a PCM layer 56, which is deposited conformally over the second dielectric layer 50 and in the pores 52, as shown in FIG. 8. In one embodiment, the PCM layer 56 is deposited using chemical vapor deposition (CVD). The PCM layer 56 may then be etched back, to remove the portions of the PCM layer 56 on the second dielectric layer 50 and on the pores 52, and form PCM portions 58 in the pores 52. The PCM layer 56 may be over-etched to leave recesses above the PCM portions 58 in the pores 52.

Figure 9:
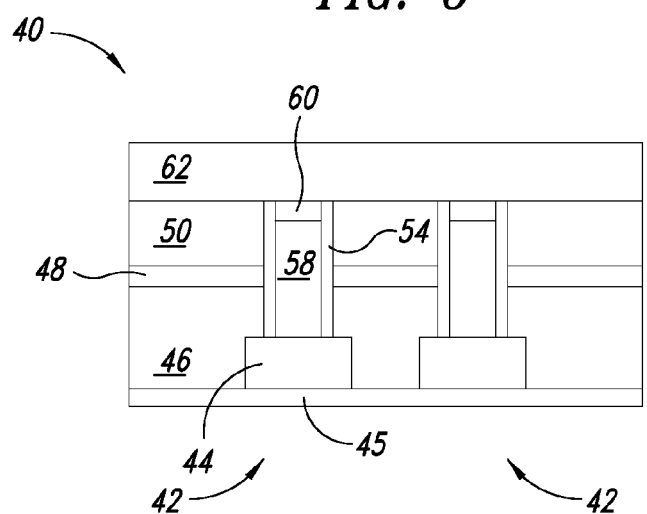

In FIG. 9, top electrodes 60 are deposited over the PCM portions 58 in the recesses of the pores 52 and between the walls of the dielectric spacers 54, respectively. Alternative, the top electrodes 60 may be formed over the dielectric spacers 54 either within the boundaries of the pores 52 or above the pores. The PCM layer 58 and dielectric spacers 54 may be etched to form a smooth surface onto which the top electrodes 60 can form. The top and bottom electrodes 60, 44 may be formed of a thin film material such as titanium, titanium nitride, titanium tungsten, carbon, silicon carbide, titanium aluminum nitride, titanium silicon nitride, polycrystalline silicon, tantalum nitride, some combination of these films, or other suitable conductors or resistive conductors.

Figure 10:
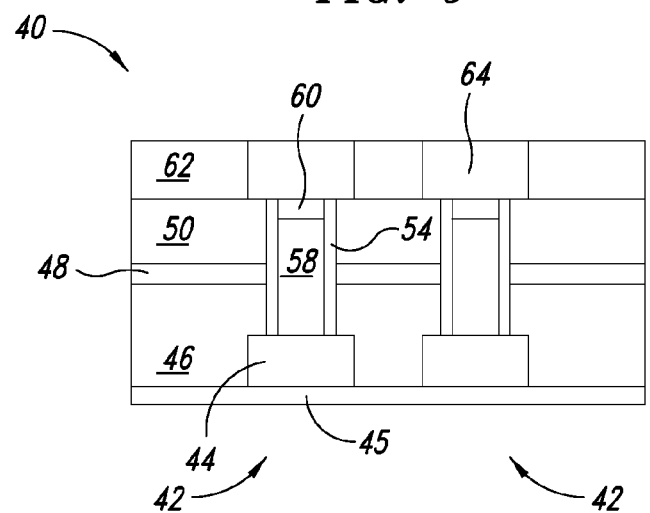

After forming the top electrodes 60, a third dielectric layer 62 and bitlines 64 are formed. The dielectric layer 62 and bitlines 64 can be formed by a damascene process as illustrated in FIGS. 9-10. In FIG. 9, the third dielectric layer 62 is deposited over the second dielectric layer 50, the dielectric spacers 54, and the top electrodes 60. The third dielectric layer 62 is then etched to form pores (not shown) over the top electrodes 60, the dielectric spacers 54, and portions of the second dielectric 50. Then, the pores are filled with the conductive bitlines 64. As with the wordline 45, the bitlines 64 can be formed using additive or subtractive processes. For example, in one embodiment the bitlines 64 are deposited as sheets on the entire structure, including the dielectric spacers 54, the second dielectric layer 50, and the top electrodes 60. The sheets are then etched back using a mask to form the separate bitlines 64, and then the third dielectric layer 62 is formed between the bitlines 64.

The embodiments discussed above significantly reduce programming currents by improving the read margin during a read of the PCM cell. A reduction in programming current results in a reduction in the heat dissipation and therefore increases the reliability of the memory device. In addition, inclusion of the pinch plate layer may increase the threshold voltage, which is especially advantageous if an OTS is the select device.

Advantageously, the pinch plate layer 22, 48 is simple to fabricate and incorporates easily into current process techniques. In addition, inclusion of the pinch plate layer does not affect the minimum cell size. Control of the device through the pinch plate is expected to increase as device dimensions scale downward, since the depletion region becomes proportionally larger with respect to the physical size of the phase change memory element.

The active pinch plate layer may be applied across a plurality of memory cells. In the vertically integrated memory array, the pinch plate layer 22, 48 may be formed as one layer with pores formed for each PCM cell, i.e., a "Swiss cheese" pattern between all memory elements. The dielectric spacer always separates the PCM layer from the pinch plate layer.

Figure 11:
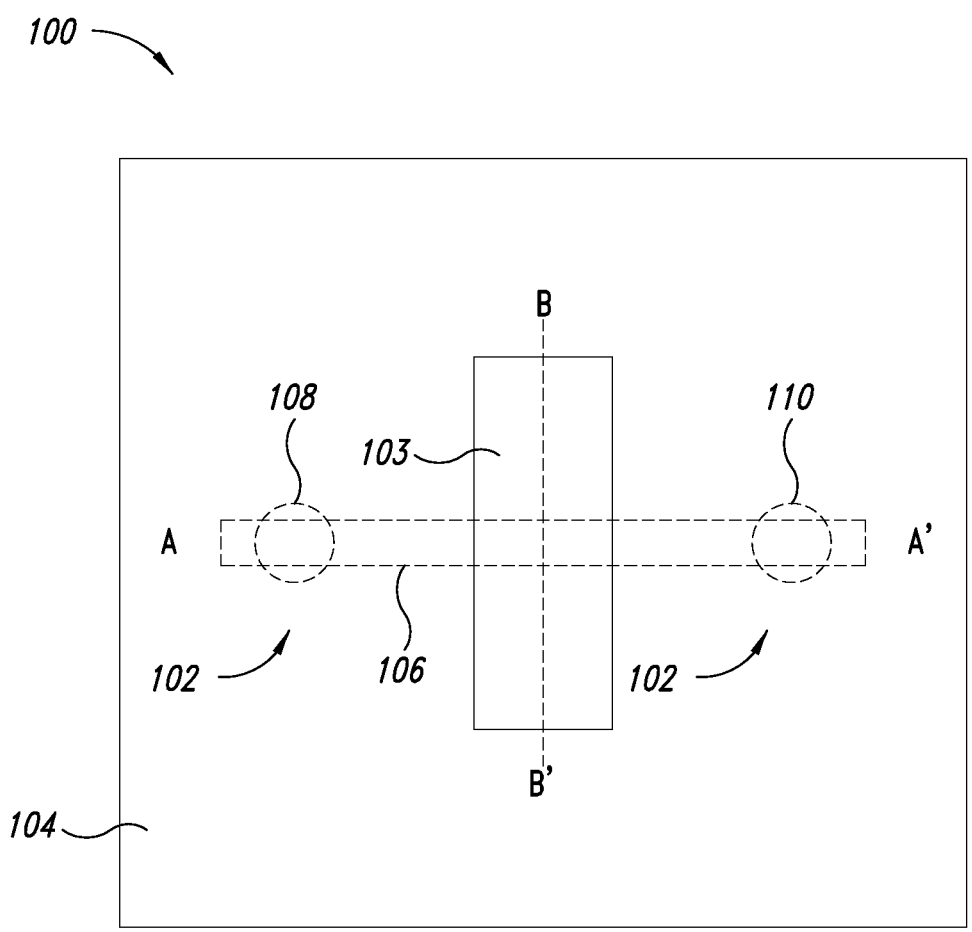
FIG. 11 is an enlarged top view of an alternative embodiment in accordance with the present disclosure.

FIG. 11 illustrates a top view of a PCM device 100 with a laterally integrated PCM cell 102 in an alternative embodiment in accordance with the present disclosure. A pinch plate layer 103 is positioned in a dielectric layer 104 and extends longitudinally in a first direction along axis BB'. The pinch plate layer 103 is placed above a PCM layer 106 that extends longitudinally in a second direction along axis AA' that is transverse to the axis BB'. The PCM layer 106 extends over and contacts first and second electrodes 108, 110.

Figure 12:
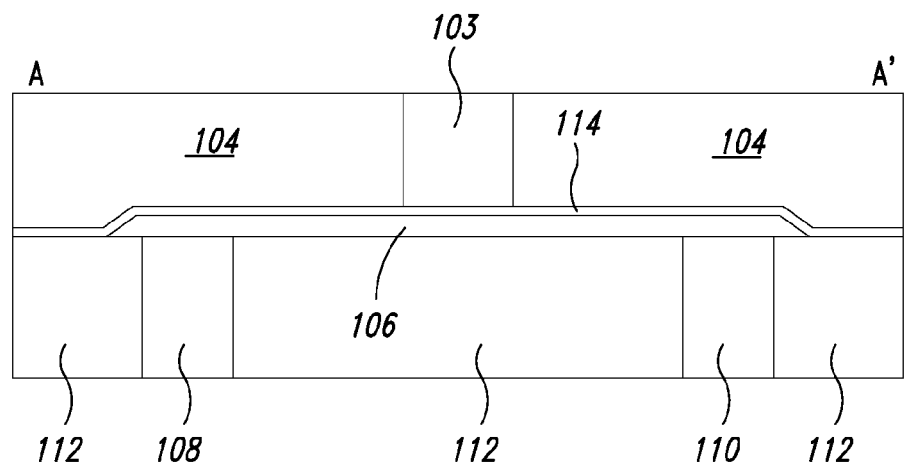
FIG. 12 is an enlarged cross-sectional view of FIG. 11, taken through A-A', in accordance with one embodiment of the present disclosure.
Figure 13:
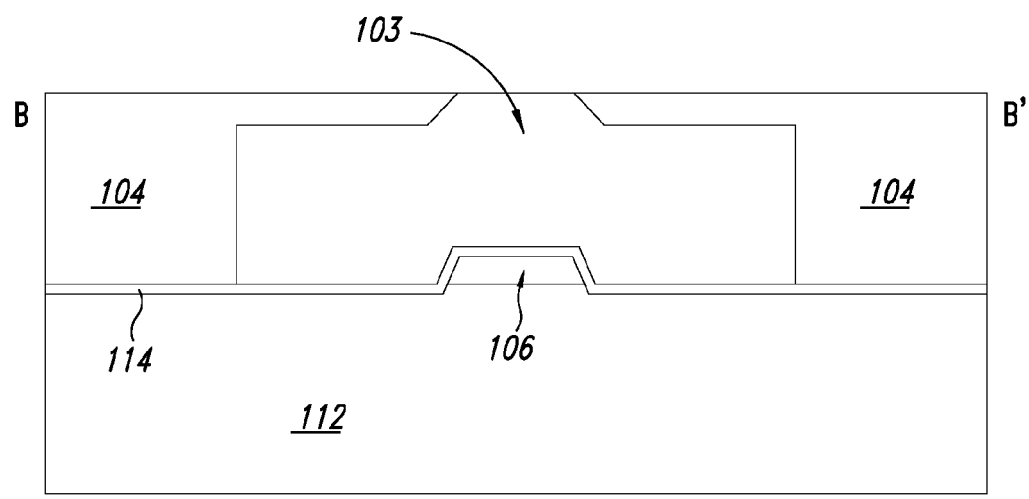
FIG. 13 is an enlarged cross-sectional view of FIG. 11, taken through B-B', in accordance with the embodiment of FIG. 12.

FIGS. 12 and 13 are cross-sectional views of the laterally integrated PCM cell 100 of FIG. 11 taken through A-A' and B-B', respectively, in accordance with one embodiment of the present disclosure. The electrodes 108, 110 are formed in a first dielectric layer 112, as seen in FIG. 12. In FIGS. 12 and 13, the PCM layer 106 is deposited onto a planar surface of the electrodes 108, 110 and first dielectric layer 112 and subtractively etched. A second dielectric layer 114 is conformally deposited on the PCM layer 106 and the first dielectric layer 112. The second dielectric layer 114 separates the PCM layer 106 from the pinch plate layer 103. The PCM layer 106 has a significantly smaller cross-section than the pinch plate layer 103, as seen in FIG. 12. The dielectric layer 104 is deposited over the second dielectric layer 114 and laterally surrounding the pinch plate layer 103.

Figure 14:
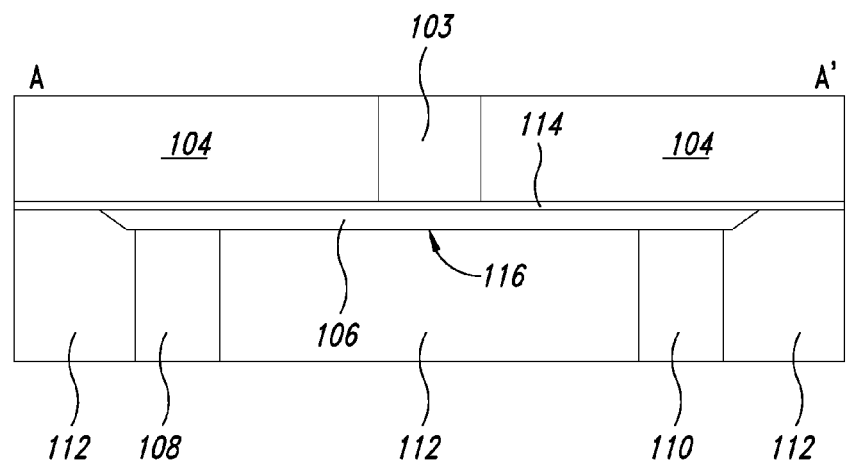
FIG. 14 is an enlarged cross-sectional view of FIG. 11, taken through A-A', in accordance with another embodiment of the present disclosure.
Figure 15:
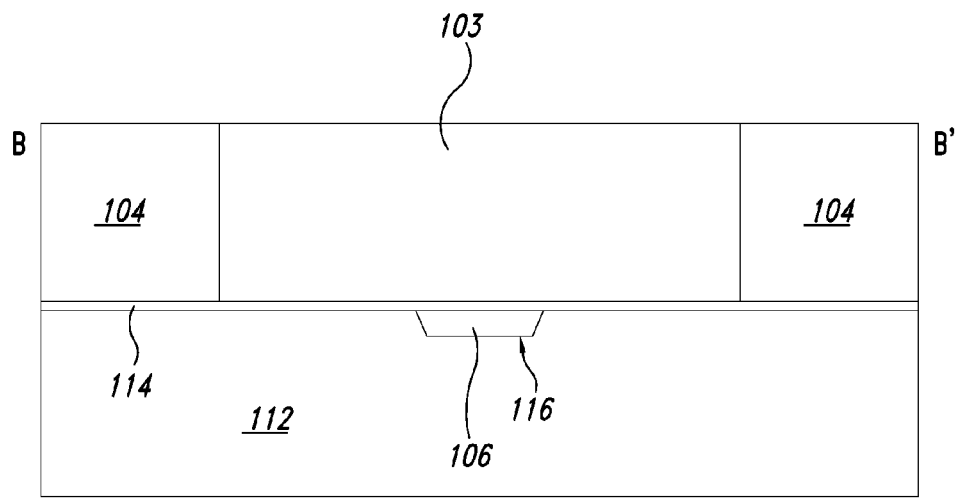
FIG. 15 is an enlarged cross-sectional view of FIG. 11, taken through B-B', in accordance with the embodiment of FIG. 14.

FIGS. 14 and 15 illustrate an alternative process flow for forming the PCM cell 100 in FIG. 11, taken through the cross-section A-A' and B-B', respectively. The first and second electrodes 108, 110 and the first dielectric layer 112 are formed as described above by either an additive or a subtractive process. The first and second electrodes 108, 110 and the first dielectric layer 112 are etched to form a recess 116. The PCM layer 106 is deposited into the recess 116 and the PCM layer 106 is planarized, such as by CMP. The dielectric spacer 114 is then deposited on the PCM layer 106 and the first dielectric layer 112. As discussed above, the dielectric layer 114 separates the PCM layer 106 from the pinch plate layer 103 formed in the dielectric layer 104.

Although only a single PCM cell 102 of the PCM device 100 is shown in FIGS. 11-15, it will be understood that the PCM device can include many such PCM cells 102 in one embodiment. The pinch plate layer 103 could extend as a strip above an entire row or column of PCM cells 102 formed with respective PCM layers 106 extending between respective first and second electrodes 108, 110 and respective first dielectric layers 114 insulating the respective PCM layers from the pinch plate layer 103. Of course, the PCM device 100 could also include many such rows or columns with respective strip-shaped pinch plate layers 103.

Figure 16:
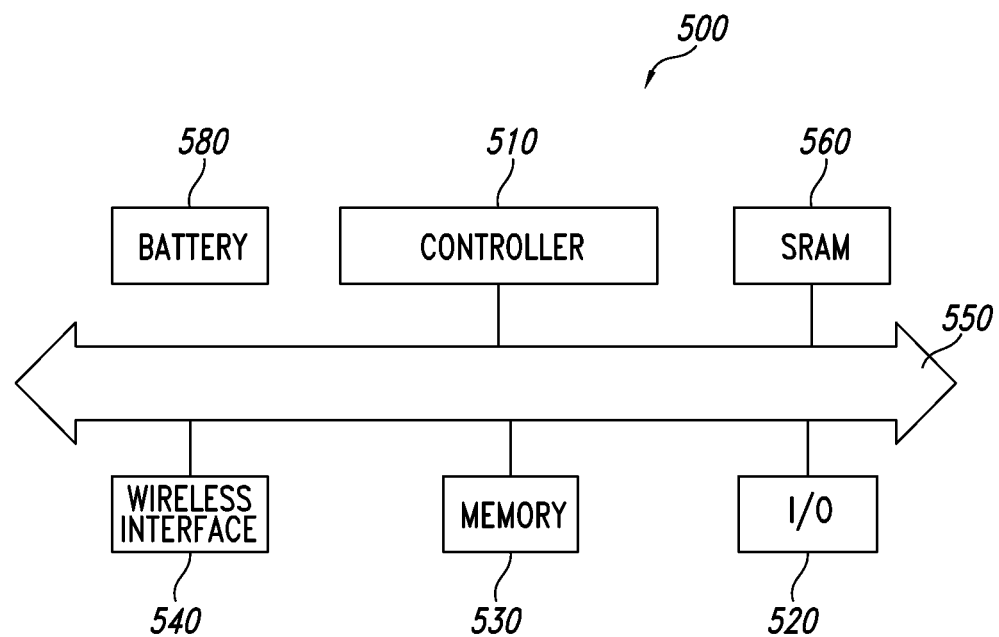
FIG. 16 is a block diagram of a system that includes a phase change memory.

Turning to FIG. 16, a portion of a system 500 in accordance with an embodiment of the present disclosure is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g., a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A method, comprising:
  forming a lateral phase change memory cell, the forming including:
    forming a first opening and a second opening in a first dielectric layer, the first opening being separated from the second opening;
    forming a first electrode and a second electrode in the first and second openings, respectively;
    forming a phase change layer on the first dielectric layer and on the first and second electrodes, the phase change layer extending longitudinally in a first direction between the first electrode and the second electrode, the phase change layer having a first region electrically coupled to the first electrode, a second region electrically coupled to the second electrode, and an intermediate region between the first region and the second region;
    forming a second dielectric layer on the phase change layer; and
    forming a conductive layer on the second dielectric layer, the conductive layer extending longitudinally in a second direction that is transverse to the first direction, the conductive layer being positioned directly above the intermediate region of the phase change layer, the conductive layer being separated from the phase change layer by the second dielectric layer and from the first and second electrodes by the phase change layer and the second dielectric layer, the conductive layer being electrically isolated from the first and the second electrodes, and the conductive layer being configured to produce a carrier depletion region in the intermediate region of the phase change layer.

2. The method of claim 1 wherein:
forming the lateral phase change memory cell includes:
forming a recess in the first dielectric layer after forming the first and second electrodes, the recess extending between the first and second electrodes; and
depositing the phase change layer in the recess.

3. The method of claim 1, wherein a first surface of the first electrode and a second surface of the second electrode are coplanar with a third surface of the first dielectric layer.

4. The method of claim 3, further comprising forming the phase change layer on the coplanar surfaces of the first dielectric layer and the first and second electrodes.

5. The method of claim 1 wherein the phase change layer has a first dimension in the first direction and a second dimension in the second direction and the conductive layer has a third dimension in the first direction and a fourth dimension in the second direction, the first dimension being greater than the third dimension and the second dimension being less than the fourth dimension.

6. The method of claim 1, further comprising forming the conductive layer on the second dielectric layer centrally positioned between the first and second electrodes.

7. The method of claim 1, further comprising forming the phase change layer to have a length in the first direction that is greater than a width in the second direction.

8. The method of claim 1 wherein forming the phase change memory cell includes forming the second dielectric layer in direct contact with the phase change layer and forming the conductive layer in direct contact with the second dielectric layer.

9. A phase change memory, comprising:
a lateral phase change memory cell that includes:
a first dielectric layer;
first and second electrodes formed in the first dielectric layer and spaced apart from one another;
a phase change layer formed on the first and second electrodes and on the first dielectric layer, the phase change layer extending longitudinally in a first direction between the first and second electrodes, and the phase change layer having a first region electrically coupled to the first electrode, a second region electrically coupled to the second electrode, and an intermediate region positioned between the first region and the second region;
a second dielectric layer on the phase change layer; and
a conductive layer on the second dielectric layer, the conductive layer extending longitudinally in a second direction that is transverse to the first direction, the conductive layer being positioned directly above the intermediate region of the phase change layer, the conductive layer being separated from the phase change layer by the second dielectric layer, the conductive layer being electrically isolated from the first and the second electrodes, and the conductive layer being configured to produce a carrier depletion region in the intermediate region of the phase change layer.

10. The phase change memory of claim 9 wherein:
the phase change memory cell includes a recess formed in the first dielectric layer, the recess extending between the first and second electrodes; and
the phase change layer is in the recess.

11. The memory of claim 9 wherein a first surface of the first electrode and a second surface of the second electrode are coplanar with a third surface of the first dielectric layer.

12. The memory of claim 11 wherein the phase change layer is on the coplanar surfaces of the first dielectric layer and the first and second electrodes.

13. The memory of claim 9 wherein the phase change layer has a first dimension in the first direction and a second dimension in the second direction and the conductive layer has a third dimension in the first direction and a fourth dimension in the second direction, the first dimension being greater than the third dimension and the second dimension being less than the fourth dimension.

14. The memory of claim 9 wherein the conductive layer is centrally positioned between the first and second electrodes.

15. The memory of claim 9 wherein the phase change layer has a first dimension that is greater than a second dimension, the second dimension extending laterally between the first electrode and the second electrode.

16. A system, comprising:
a phase change memory, including:
a lateral phase change memory cell that includes:
a first dielectric layer;
first and second electrodes formed in the first dielectric layer and spaced apart from one another;
a phase change layer formed on the first and second electrodes and on the first dielectric layer, the phase change layer extending longitudinally in a first direction between the first and second electrodes, and the phase change layer having a first region electrically coupled to the first electrode, a second region electrically coupled to the second electrode, and an intermediate region positioned between the first electrode and the second electrode;
a second dielectric layer on the phase change layer; and
a conductive layer on the second dielectric layer, the conductive layer extending longitudinally in a second direction that is transverse to the first direction, the conductive layer being positioned directly above the intermediate region of the phase change layer, and the conductive layer being electrically isolated from the first electrode and the second electrode.

17. The system of claim 16 wherein:
the phase change memory cell includes a recess formed in the first dielectric layer, the recess extending between the first and second electrodes; and
the phase change layer is in the recess.

18. The system of claim 16 wherein a first surface of the first electrode and a second surface of the second electrode are coplanar with a third surface of the first dielectric layer.

19. The system of claim 18 wherein the phase change layer is on the coplanar surfaces of the first dielectric layer and the first and second electrodes.

20. The system of claim 16 wherein the phase change layer has a first dimension in the first direction and a second dimension in the second direction and the conductive layer has a third dimension in the first direction and a fourth dimension in the second direction, the first dimension being greater than the third dimension and the second dimension being less than the fourth dimension.

21. The system of claim 16 wherein the conductive layer is centrally positioned between the first and second electrodes.

22. The system of claim 16 wherein the phase change layer has a length in the first direction that is greater than a width in the second direction.

* * * * *